(12) United States Patent
Kishibe

(10) Patent No.: US 10,033,415 B2
(45) Date of Patent: Jul. 24, 2018

(54) TRANSMITTER AND DISTORTION CORRECTION METHOD

(71) Applicant: ICOM INCORPORATED, Osaka (JP)

(72) Inventor: Shinnichi Kishibe, Osaka (JP)

(73) Assignee: ICOM INCORPORATED, Osaka (JP)

( * ) Notice: Subject to any disclaimer, the term of this patent is extended or adjusted under 35 U.S.C. 154(b) by 0 days.

(21) Appl. No.: 15/718,120

(22) Filed: Sep. 28, 2017

(65) Prior Publication Data

US 2018/0115332 A1 Apr. 26, 2018

(30) Foreign Application Priority Data

Oct. 21, 2016 (JP) .................. 2016-206836

(51) Int. Cl.
    *H03F 1/32* (2006.01)
    *H04B 1/04* (2006.01)

(52) U.S. Cl.
    CPC ......... *H04B 1/0475* (2013.01); *H03F 1/3241* (2013.01); *H03F 2201/3233* (2013.01)

(58) Field of Classification Search
    CPC ................. H04B 1/0475; H03F 1/3241; H03F 2201/3233; H03F 1/3247
    See application file for complete search history.

(56) References Cited

U.S. PATENT DOCUMENTS

| | | | | |
|---|---|---|---|---|
| 2005/0104758 A1* | 5/2005 | Funyu | .................. | H03F 1/3247 341/139 |
| 2005/0140438 A1* | 6/2005 | Jin | ........................ | H03F 1/3241 330/149 |
| 2008/0008263 A1* | 1/2008 | Keerthi | .................. | H03F 1/0222 375/297 |
| 2008/0152037 A1* | 6/2008 | Kim | ...................... | H03F 1/3247 375/297 |
| 2008/0174365 A1* | 7/2008 | Yang | .................... | H03F 1/3247 330/149 |

(Continued)

FOREIGN PATENT DOCUMENTS

| | | |
|---|---|---|
| JP | 8-79143 A | 3/1996 |
| JP | 2004-343594 A | 12/2004 |
| JP | 2011-188093 A | 9/2011 |

*Primary Examiner* — Syed Haider
(74) *Attorney, Agent, or Firm* — Ohlandt, Greeley, Ruggiero & Perle, L.L.P.

(57) ABSTRACT

A data calculator repeatedly calculates electric power of a delayed transmission signal and a multiplication value of a complex conjugate of the delayed transmission signal and a feedback signal. A memory stores, for each delayed electric power address corresponding to the electric power, a first total value that is the total of electric power of the delayed transmission signal and a second total value that is the total of the multiplication value. A range adjuster adjusts the upper limit of a determination reference range according to the maximum reference address. When a determiner determines that the number of repeats of the data calculator is sufficient based on the determination reference range, a vector calculator calculates a distortion correction vector based on a distortion vector calculated from the ratio between the first total value and the second total value. An updater updates the distortion correction vector stored in a look-up table based on the distortion correction vector.

14 Claims, 10 Drawing Sheets

(56) References Cited

U.S. PATENT DOCUMENTS

2010/0271124 A1\* 10/2010 Lozhkin ............... H03F 1/3247
330/149
2011/0063026 A1\* 3/2011 Jung .................... H03F 1/0266
330/149

\* cited by examiner

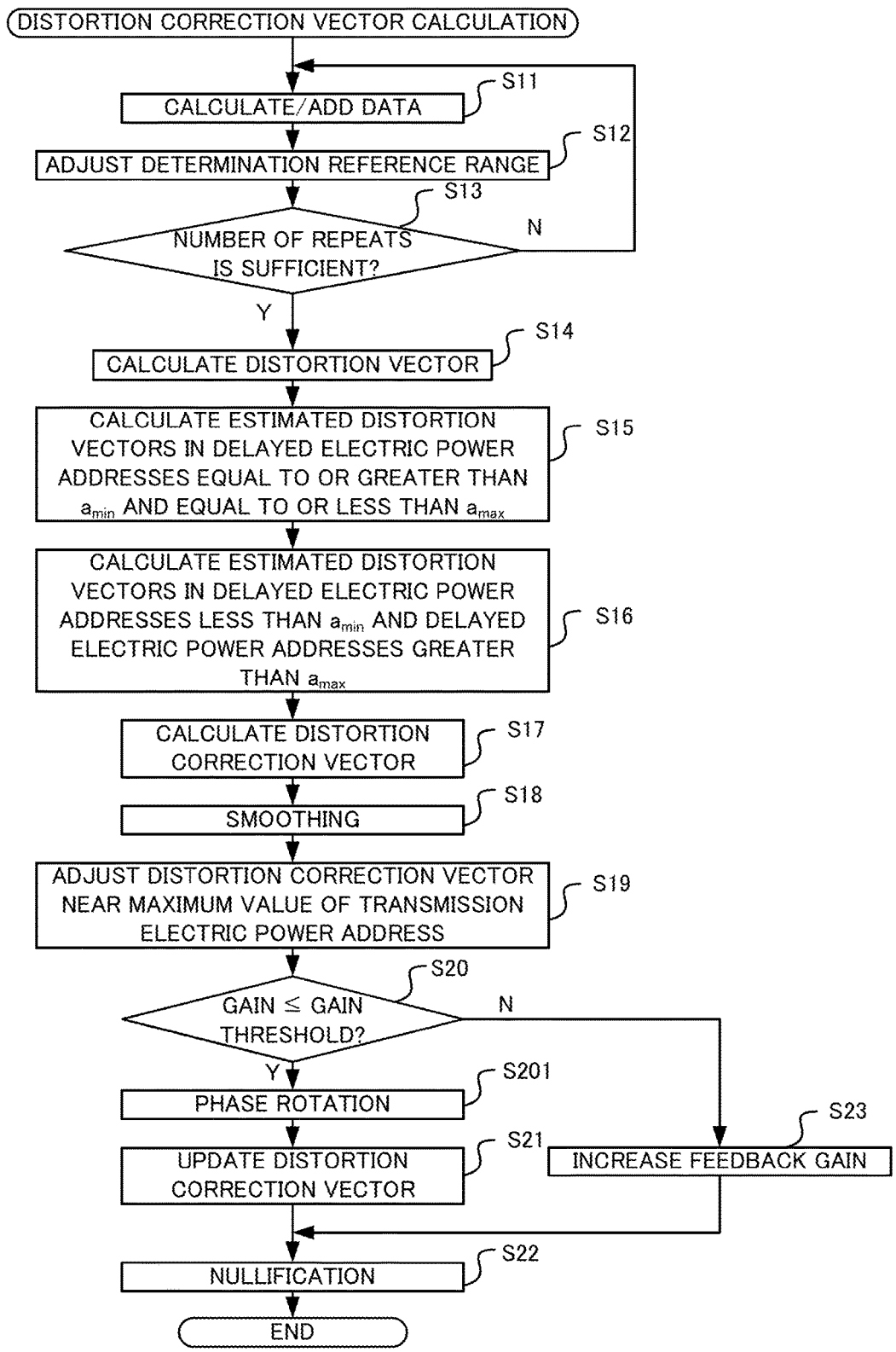

TRANSMITTER AND DISTORTION CORRECTION METHOD

CROSS-REFERENCE TO RELATED APPLICATION

This application claims the benefit of Japanese Patent Application No. 2016-206836, filed on Oct. 21, 2016, the entire disclosure of which is incorporated by reference herein.

FIELD

This application relates generally to a transmitter performing distortion correction for suppressing distortion occurring in an amplifier and a distortion correction method for suppressing distortion occurring in an amplifier.

BACKGROUND

In transmitters, in order to suppress non-linear distortion caused by the amplifier, digital pre-distortion (DPD) is performed for correcting transmission signals using distortion correction coefficients. In the DPD, digital sound signals are multiplied by a distortion correction vector stored in a look-up table (LUT), the distortion correction vector corresponding to the amplitude of the digital sound signals.

The orthogonal frequency-division multiplexing (OFDM) modulator disclosed in Unexamined Japanese Patent Application Kokai Publication No. 2011-188093 extracts, for each given sample, an error signal that is an error between a baseband signal corresponding to an input signal and a feedback signal from an amplifier, calculates the average values of error signals, and interpolates between the average values. The OFDM modulator estimates a distortion based on the interpolated average values of error signals and creates data for distortion compensation from the distortion.

The non-linear distortion compensation transmission device disclosed in Unexamined Japanese Patent Application Kokai Publication No. 2004-343594 compares input signals with output signals of an analog-to-digital (A-D) converter and detects distortion components that are the differences. For updating the compensation data for offsetting the non-linear distortion components, the approximate calculation interval is shifted, function approximation is performed on the compensation data in the shifted approximate calculation interval, and the compensation data are updated.

In order to reduce the time to calculate distortion correction values, the radio device disclosed in Unexamined Japanese Patent Application Kokai Publication No. H08-079143 compares output of a transmitting amplifier with input signals entered into the transmitter to output the quantity of distortion of the transmitting amplifier that should be corrected, and further obtains distortion correction values at a time by interpolation using the quantity of distortion. The output distortion occurring in the transmitting amplifier is corrected by preliminarily correcting modulation signals with the distortion correction values and entering the modulation signals into the transmitting amplifier.

SUMMARY

The transmitter according to a first example aspect of the present disclosure comprises:
an amplifier to amplify entered signals;
a look-up table to store a distortion correction vector for each transmission electric power address corresponding to electric power of a transmission signal;
a digital pre-distortion processor to correct the transmission signal according to the distortion correction vector stored in the look-up table and to enter the corrected transmission signal into the amplifier;
a data calculator to repeat, based on a delayed transmission signal that is a signal as a result of delaying the transmission signal and a feedback signal that is feedback of the transmission signal amplified by the amplifier, calculation of electric power of the delayed transmission signal, and calculation of a multiplication value of the feedback signal and a complex conjugate of the delayed transmission signal;
a memory to store, for each delayed electric power address corresponding to the electric power of the delayed transmission signal, a first total value that is a total of the repeatedly calculated electric power of the delayed transmission signal and a second total value that is a total of the repeatedly calculated multiplication value;
a range adjuster to adjust an upper limit of a determination reference range according to a maximum reference address that is a maximum value among reference addresses that are the delayed electric power addresses for which the first total value and the second total value are present;
a determiner to determine, when the maximum reference address is equal to or greater than the upper limit of the determination reference range, that a number of repeats of the calculation of the electric power of the delayed transmission signal and the calculation of the multiplication value that are performed by the data calculator is sufficient;
a vector calculator to calculate the distortion correction vector based on a distortion vector calculated from a ratio between the first total value and the second total value in each reference address and to output the distortion correction vector when the determiner determines that the number of repeats is sufficient; and
an updater to update the distortion correction vector stored in the look-up table based on the distortion correction vector output by the vector calculator,
wherein the first total value and the second total value stored in the memory are nullified after completion of processing by the updater.

Preferably, the range adjuster increments the upper limit when a difference obtained by subtracting the upper limit from the maximum reference address is a positive difference, and decrements the upper limit when the difference is a negative difference, and
an increment of the upper limit with respect to the positive difference is equal to or greater than a decrement of the upper limit with respect to the negative difference having the same absolute value as the positive difference.

Preferably, the range adjuster sets, based on an average value of the reference addresses equal to or greater than the upper limit, a minimum natural number greater than the average value as the upper limit when the difference is positive, and the range adjuster sets, based on a result of calculation on the upper limit that is prescribed to decrement the upper limit, a maximum natural number equal to or less than the result of calculation as the upper limit when the difference is negative.

Preferably, the range adjuster adjusts a lower limit of the determination reference range according to the upper limit.

Preferably, the determiner determines that the number of repeats is sufficient when the maximum reference address is equal to or greater than the upper limit and a minimum reference address that is a minimum value among the reference addresses is equal to or less than a lower limit of the determination reference range.

Preferably, the determiner determines that the number of repeats is sufficient when the maximum reference address is equal to or greater than the upper limit and the minimum reference address is equal to or less than the lower limit of the determination reference range and the number of reference addresses is equal to or greater than a value obtained by multiplying a difference between the maximum reference address and the minimum reference address by a positive number less than 1.

Preferably, the updater updates the distortion correction vector stored in the look-up table at multiple times according to a plurality of vectors constituting a difference vector between the distortion correction vector output by the vector calculator and the distortion correction vector stored in the look-up table.

Preferably, a phase rotator to rotate a phase of the distortion correction vector output by the vector calculator by a prescribed quantity and to output the phase-rotated distortion correction vector is further provided, and the updater performs processing of updating the distortion correction vector stored in the look-up table based on the distortion correction vector that is phase-rotated by the phase rotator.

Preferably, the phase rotator rotates the phase of the distortion correction vector by a common prescribed quantity.

Preferably, the vector calculator calculates an estimated distortion vector, in each of the delayed electric power addresses for which the first total value and the second total value are absent, each delayed electric power addresses being equal to or greater than a minimum reference address that is a minimum value among the reference addresses and equal to or less than the maximum reference address, by interpolation based on the distortion vectors in the reference addresses, regards the distortion vector corresponding to the minimum reference address as an estimated distortion vector corresponding to the delayed electric power address that is less than the minimum reference address and regards the distortion vector corresponding to the maximum reference address as an estimated distortion vector corresponding to the delayed electric power address that is greater than the maximum reference address, and calculates the distortion correction vector from each estimated distortion vector.

Preferably, when a maximum value of a gain of the distortion correction vector in a plurality of successive transmission electric power addresses from a maximum value of the transmission electric power address is greater than a gain of the distortion correction vector in the maximum value of the transmission electric power address, the vector calculator regards the distortion correction vector in the transmission electric power address corresponding to the maximum value of the gain of the distortion correction vector as the distortion correction vector in the transmission electric power addresses greater than the transmission electric power address corresponding to the maximum value of the gain of the distortion correction vector.

Preferably, a gain determiner to determine whether a gain of the distortion correction vector output by the vector calculator is equal to or less than a gain threshold is further provided, when the gain determiner determines that the gain of the distortion correction vector is equal to or less than the gain threshold, the processing by the updater is performed, and when the gain determiner determines that the gain of the distortion correction vector is greater than the gain threshold, the first total value and the second total value stored in the memory are nullified without performing the processing by the updater.

Preferably, a gain adjuster to increase a gain of the feedback signal when the gain determiner determines that the gain of the distortion correction vector is greater than the gain threshold is further provided.

The distortion correction method according to a second example aspect of the present disclosure is a distortion correction method executed by a transmitter correcting a transmission signal according to a distortion correction vector stored in a look-up table for each transmission electric power address corresponding to the electric power of the transmission signal and amplifying the transmission signal with an amplifier, comprising the following:

repeating, based on a delayed transmission signal that is a signal as a result of delaying the transmission signal and a feedback signal that is feedback of the transmission signal amplified by the amplifier, calculation of the electric power of the delayed transmission signal, and calculation of a multiplication value of the feedback signal and a complex conjugate of the delayed transmission signal;

calculating, for each delayed electric power address corresponding to the electric power of the delayed transmission signal, a first total value that is a total of the repeatedly calculated electric power of the delayed transmission signal and a second total value that is a total of the repeatedly calculated multiplication value;

adjusting an upper limit of a determination reference range according to a maximum reference address that is a maximum value among reference addresses that are the delayed electric power addresses for which the corresponding first total value and second total value are present;

determining, when the maximum reference address is equal to or greater than the upper limit of the determination reference range, that a number of repeats of calculating the electric power of the delayed transmission signal and calculating the multiplication value is sufficient;

calculating the distortion correction vector based on a distortion vector calculated from a ratio between the first total value and the second total value in the reference address when determined that the number of repeats is sufficient; and updating the distortion correction vector stored in the look-up table based on the distortion correction vector.

The present disclosure makes it possible to reduce the time required for the distortion correction vector update procedure while maintaining distortion correction properties by adjusting the upper limit of the determination reference range according to the maximum reference address.

BRIEF DESCRIPTION OF THE DRAWINGS

A more complete understanding of this application can be obtained when the following detailed description is considered in conjunction with the following drawings, in which:

FIG. 10 is a flowchart illustrating an example operation of the distortion correction vector calculation procedure executed by the transmitter according to Embodiment 2.

DETAILED DESCRIPTION

As the temperature of an amplifier changes with time, the quantity of non-linear distortion changes. In order to deal with the change in quantity of non-linear distortion, distortion correction vectors stored in a look-up table (LUT) have to be updated as needed while a transmitter is in operation. The amplitude of digital sound signals varies in value while the transmitter is in operation. Therefore, it takes time to collect distortion characteristics data corresponding to all addresses on the LUT, namely all possible values of the amplitude of the digital sound signals, and used in calculating distortion correction vectors, and it takes time before the distortion correction vectors are updated in some cases. It is possible to reduce the time before the distortion correction vectors are updated by updating the distortion correction vectors based on distortion characteristics data obtained for some addresses on the LUT. However, some distortion correction characteristics may deteriorate.

The present disclosure is made with the view of the above situation and an objective of the present disclosure is to reduce the time required for the distortion correction vector update procedure while maintaining distortion correction properties.

Embodiments of the present disclosure are described in detail below with reference to the drawings. Here, the same or corresponding parts are referred to by the same reference numbers as in the figures.

Embodiment 1

Figure 1:
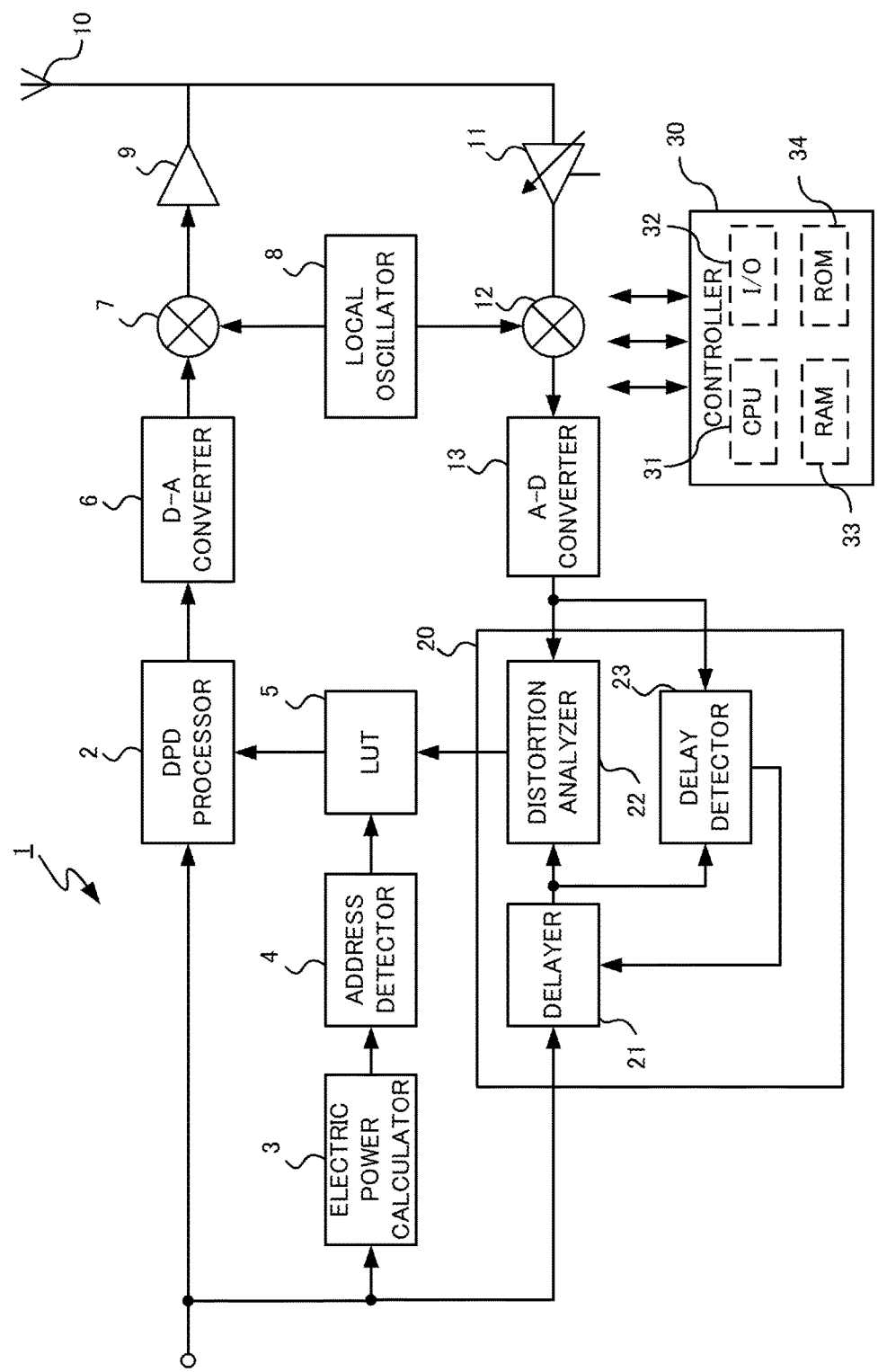
FIG. 1 is a block diagram illustrating an example configuration of a transmitter according to Embodiment 1 of the present disclosure.

FIG. 1 is a block diagram illustrating an example configuration of a transmitter according to Embodiment 1 of the present disclosure. A transmitter 1 amplifies entered transmission signals and transmits the amplified transmission signals from an antenna 10. The transmitter 1 performs pre-distortion to preliminarily correct distortion of the transmission signals that occurs during amplification. Each part of the transmitter 1 is controlled by a controller 30. The controller 30 includes a central processing unit (CPU) 31, a random access memory (RAM) 33, and a read-only memory (ROM) 34. For elimination of complexity and easier understanding, signal lines from the controller 30 to each part are omitted. The controller 30 is connected to each part of the transmitter 1 via an input/output (I/O) 32 and controls the start, end, and content of processing by each part. The ROM 34 stores control programs for the controller 30 to control the operation of the transmitter 1. The controller 30 controls the transmitter 1 based on the control programs. The parts of the transmitter 1 are described below.

Transmission signals entered into the transmitter 1 from a not-illustrated transmission source are entered into a digital pre-distortion (DPD) processor 2, an electric power calculator 3, and an LUT updater 20. The transmission signals are two signals or in-phase and quadrature (IQ) signals such as single side band (SSB) sound signals. The electric power calculator 3 calculates and sends to an address detector 4 the electric power of the transmission signals as expressed by the equation (1) below. In the equation (1) below, S (t) is a complex transmission signal, S* (t) is a complex conjugate signal that is the complex conjugate of S (t), $S_i$ (t) is the I component of S (t), $S_q$ (t) is the Q component of S (t), and j is the imaginary unit.

[Equation 1]

$$|S(t)|^2 = S(t) \times S^*(t) \qquad (1)$$
$$= [S_i(t) + j \times S_q(t)] \times [S_i(t) - j \times S_q(t)]$$
$$= S_i^2 + S_q^2$$

The address detector 4 detects and sends to an LUT 5 a transmission electric power address a (s) corresponding to the electric power of the transmission signal as expressed by the equation (2) below. In the equation (2) below, $P_{max}$ is the maximum electric power of the transmission signal S (t) before processed by the DPD processor 2 and N is the number of bits of a digital-to-analog (D-A) converter 6.

[Equation 2]

$$a(s) = \frac{|S(t)|^2}{P_{max}} \times 2^N \qquad (2)$$

The LUT 5 outputs to the DPD processor 2 a distortion correction vector corresponding to the transmission electric power address sent by the address detector 4. The DPD processor 2 performs distortion correction to correct the transmission signal according to the distortion correction vector by complex-multiplying the transmission signal S (t) by the distortion correction vector as expressed by the equation (3) below, and sends the distortion-corrected transmission signal $S_{DPD}$ (t) to the D-A converter 6. In the equation (3) below, L (a) is the distortion correction vector output by the LUT 5 according to the transmission electric power address a (s). $L_i$ (a) is the I component of L (a) and $L_q$ (a) is the Q component of L (a).

[Equation 3]

$$S_{DPD}(t) = S(t) \times L(a) \qquad (3)$$
$$= [S_i(t) + j \times S_q(t)] \times [L_i(a) + j \times L_q(a)]$$
$$= S_i(t) \times L_i(a) - S_q(t) \times L_q(a) + j[S_i(t) \times L_q(a) + S_q(t) \times L_i(a)]$$

The D-A converter 6 converts the distortion-corrected transmission signal $S_{DPD}$ (t) from a digital signal to an analog signal and sends the converted transmission signal to a mixer 7. The mixer 7 orthogonal-modulates the digital-to-analog converted transmission signal according to a reference signal that is a signal output by a local oscillator 8 and sends the orthogonal-modulated transmission signal to an amplifier 9. The amplifier 9 amplifies and outputs to the antenna 10 the orthogonal-modulated transmission signal. The amplified transmission signal is output from the antenna 10. A feedback signal that is feedback of the transmission signal output by the amplifier 9 is entered into a gain adjuster 11. The gain adjuster 11 includes at least either an amplifier or an attenuator. The gain adjuster 11 adjusts the gain of the feedback signal and sends the gain-adjusted feedback signal to a mixer 12. The mixer 12 orthogonal-demodulates the gain-adjusted feedback signal according to a reference signal output by the local oscillator 8 and sends the orthogonal-demodulated feedback signal to an analog-to-digital (A-D) converter 13. The A-D converter 13 converts the orthogonal-demodulated feedback signal from an analog signal to a digital signal and sends the converted signal to the LUT updater 20.

Passing through the D-A converter 6, an analog circuit between the D-A converter 6 and the A-D converter 13, and the A-D converter 13, the feedback signal is delayed. Therefore, the LUT updater 20 calculates the distortion correction vector for correcting the distortion in the amplifier 9 according to the error between a transmission signal delayed according to the delay of the feedback signal and the feedback signal. The LUT updater 20 includes a delayer 21, a distortion analyzer 22, and a delay detector 23. The delayer 21 delays a transmission signal. The distortion analyzer 22 calculates the distortion correction vector according to the error between the delayed transmission signal and the feedback signal. The delay detector 23 detects the delay time the feedback signal is subject to according to the delayed transmission signal and the feedback signal. The delay time detected by the delay detector 23 is set in the delayer 21 and the transmission signal entered into the distortion analyzer 22 is delayed by the same delay time as the delay the feedback signal. The distortion analyzer 22 updates the distortion correction vector stored in the LUT 5 based on the calculated distortion correction vector. At a prescribed interval, the distortion analyzer 22 calculates the distortion correction vector and updates the distortion correction vector stored in the LUT 5.

Figure 2:
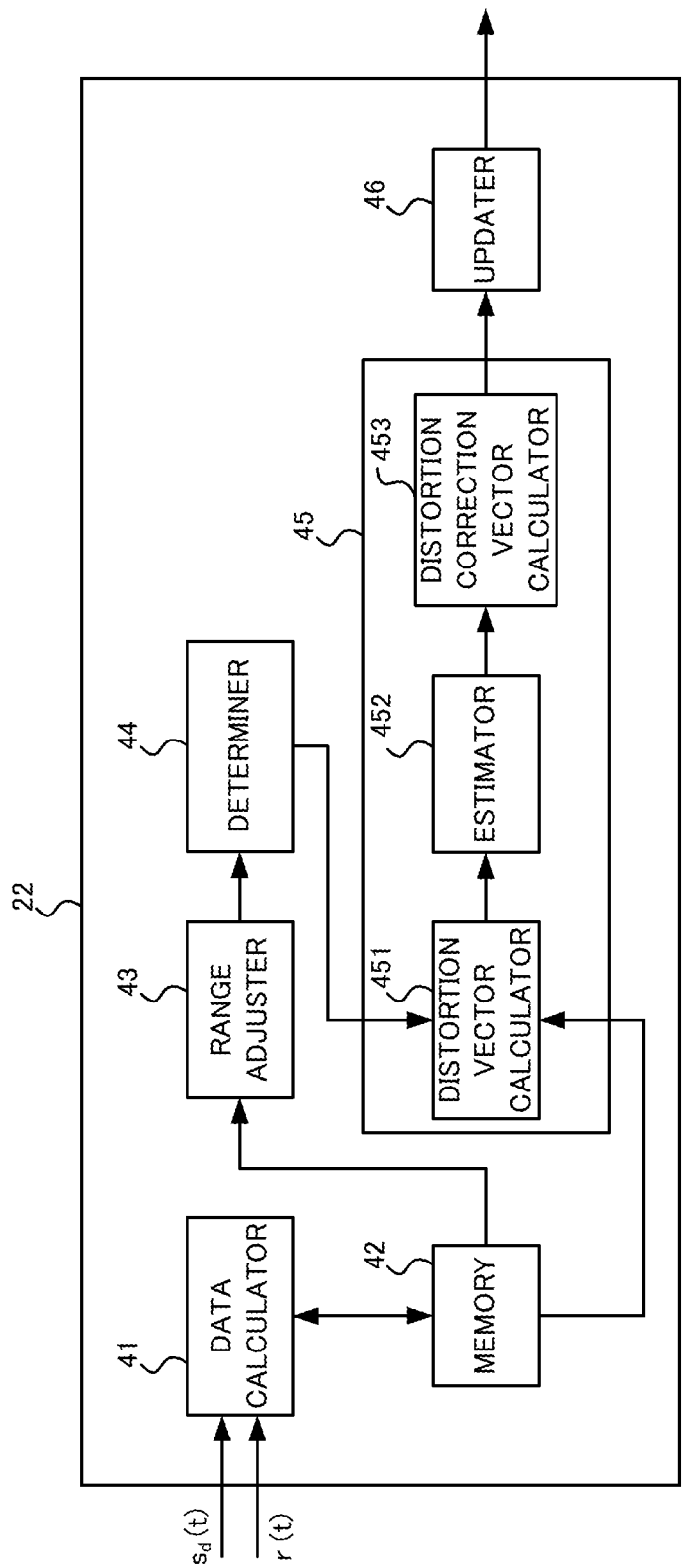
FIG. 2 is a block diagram illustrating an example configuration of a distortion analyzer according to Embodiment 1.

FIG. 2 is a block diagram illustrating an example configuration of the distortion analyzer according to Embodiment 1. The distortion analyzer 22 includes a data calculator 41, a memory 42, a range adjuster 43, a determiner 44, a vector calculator 45, and an updater 46. The data calculator 41 repeatedly calculates the data necessary for calculating a distortion vector based on a delayed transmission signal $S_d$ (t) that is a delayed transmission signal and a feedback signal r (t). The memory 42 stores the total value of the data repeatedly calculated by the data calculator 41. The range adjuster 43 adjusts the upper limit of a determination reference range described below. The determiner 44 determines whether the number of repeats of the data calculator 41 calculating the data is sufficient based on the determination reference range. The distortion analyzer 22 repeats the processing by the data calculator 41 until the determiner 44 determines that the number of repeats is sufficient. The vector calculator 45 calculates the distortion correction vector for correcting the distortion in the amplifier 9 based on the distortion vector calculated from the total value stored in the memory 42 and outputs the distortion correction vector. The updater 46 updates the distortion correction vector stored in the LUT 5 based on the distortion correction vector output by the vector calculator 45. After completion of update processing by the updater 46, the total value stored in the memory 42 is nullified. The vector calculator 45 includes a distortion vector calculator 451, an estimator 452, and a distortion correction vector calculator 453. The distortion vector calculator 451 calculates a distortion vector. The estimator 452 calculates an estimated distortion vector by estimation based on the distortion vector. The distortion correction vector calculator 453 calculates the distortion correction vector from the estimated distortion vector. The parts of the distortion analyzer 22 are described.

Figure 3:
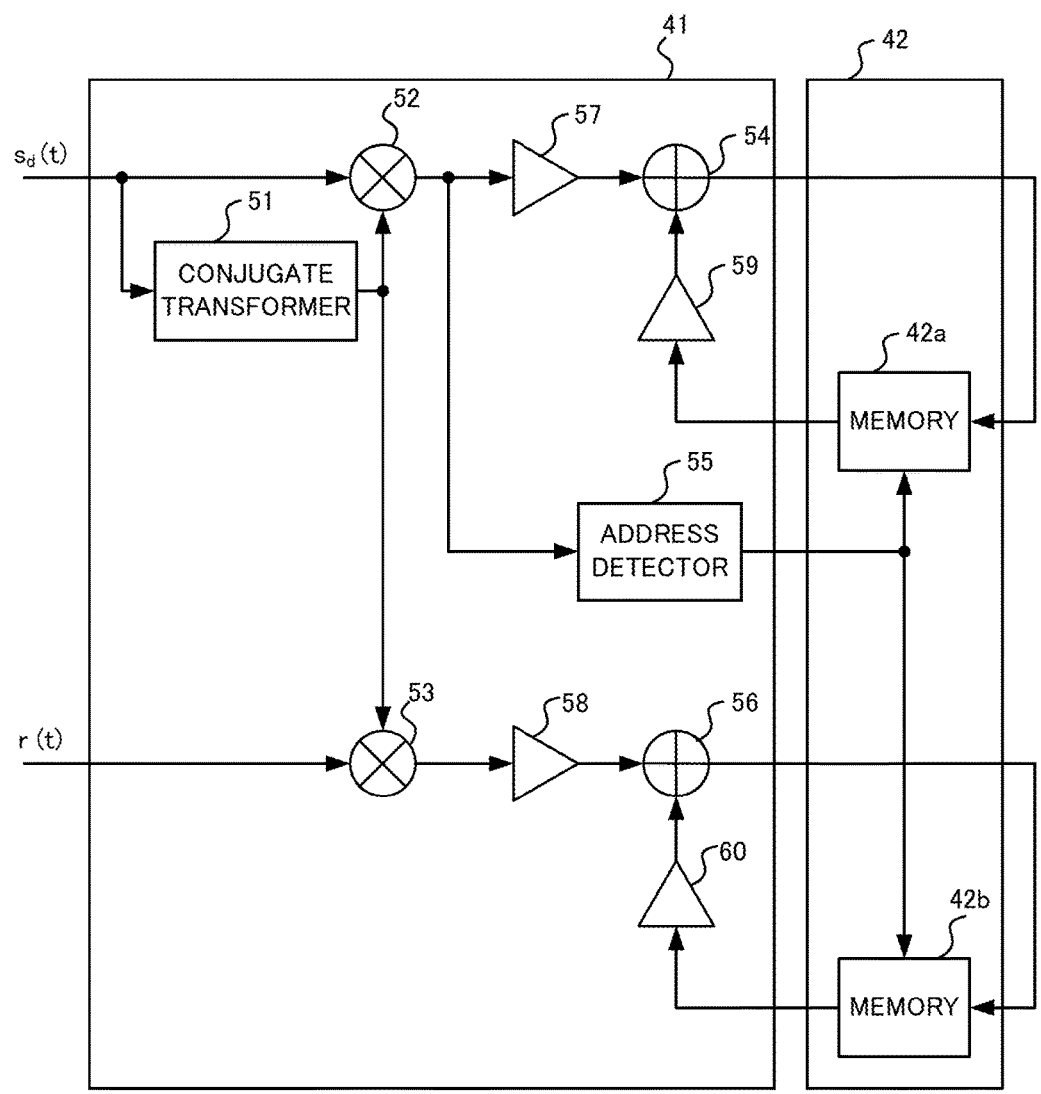
FIG. 3 is a block diagram illustrating an example configuration of a data calculator according to Embodiment 1.

FIG. 3 is a block diagram illustrating an example configuration of the data calculator according to Embodiment 1. The data calculator 41 repeatedly calculates, at each sampling time, the data necessary for calculating the distortion vector. The delayed transmission signal $S_d$ (t) is entered into a conjugate transformer 51 and a multiplier 52. The conjugate transformer 51 outputs to the multiplier 52 and a multiplier 53 a complex conjugate signal $S_d^*$ (t) that is the complex conjugate of the delayed transmission signal. The multiplier 52 performs the same complex multiplication as in the equation (1) above and outputs the electric power of the delayed transmission signal $S_d$ (t) to a coefficient multiplier 57 and an address detector 55. The multiplier 52 repeatedly calculates the electric power of the delayed transmission signal $S_d$ (t). The multiplier 53 complex-multiplies the complex conjugate signal $s_d^*$ (t) by the feedback signal r (t) and outputs the multiplication value $S_d^*$ (t) r (t) of the complex conjugate signal $S_d^*$ (t) and the feedback signal r (t) to a coefficient multiplier 58. The multiplier 53 repeatedly calculates the multiplication value $S_d^*$ (t) r (t) of the complex conjugate signal $S_d^*$ (t) and the feedback signal r (t). The address detector 55 detects a delayed electric power address a (s) corresponding to the electric power of the delayed transmission signal $S_d$ (t) as the address detector 4 does, and sends the delayed electric power address a (s) to memories 42a and 42b constituting the memory 42. When the address detector 55 detects the delayed electric power address a (s), $S_d$ (t) is used in the equation (2) above in place of S (t).

The memory 42a stores a first total value that is the total of the electric power of the delayed transmission signal $S_d$ (t) and the memory 42b stores a second total value that is the total of the multiplication value $S_d^*$ (t) r (t) of the complex conjugate signal $S_d^*$ (t) and the feedback signal r (t). The memory 42a outputs the first total value corresponding to the sent delayed electric power address a (s) to a coefficient multiplier 59 and the memory 42b outputs the second total value corresponding to the sent delayed electric power address a (s) to a coefficient multiplier 60.

The coefficient multiplier 57 multiplies the electric power of the delayed transmission signal $S_d$ (t) output by the multiplier 52 by a coefficient and outputs the multiplication result to an adder 54. The coefficient multiplier 59 multiplies the first total value output by the memory 42a by a coefficient and outputs the multiplication result to the adder 54. The adder 54 adds the electric power of the delayed transmission signal $S_d$ (t) multiplied by a coefficient by the coefficient multiplier 57 to the first total value corresponding to the delayed electric power address a (s) and multiplied by a coefficient by the coefficient multiplier 59 and stores the addition result in the memory 42a. When the coefficients of the coefficient multipliers 57 and 59 are both 1, the first total value indicates the total electric power of the delayed transmission signal $S_d$ (t) in each delayed electric power address. Alternatively, it may be possible that the coefficient of the coefficient multiplier 57 is α that is a positive number less than 1 and the coefficient of the coefficient multiplier 59 is (1−α). In such a case, the adder 54 adds the electric power of the delayed transmission signal $S_d$ (t) multiplied by a to the first total value multiplied by (1−α) and stores the addition result in the memory 42a. As a result, it is possible to suppress the saturation and prescribe that the first total value is the total value of the electric power of the delayed transmission signal $S_d$ (t) weighted more as the delayed transmission signal $S_d$ (t) is newer.

Similarly, the coefficient multiplier 58 multiplies the multiplication value $S_d^*$ (t) r (t) of the complex conjugate signal $S_d^*$ (t) and the feedback signal r (t) output by the multiplier 53 by a coefficient and outputs the multiplication result to an adder 56. The coefficient multiplier 60 multiplies the second total value output by the memory 42b by a coefficient and outputs the multiplication result to the adder 56. The adder 56 adds the multiplication value $S_d^*$ (t) r (t) of the complex conjugate signal $S_d^*$ (t) and the feedback signal r (t) that is multiplied by a coefficient by the coefficient multiplier 58 to the second total value corresponding to the delayed electric power address a (s) and multiplied by a coefficient by the coefficient multiplier 60 and stores the addition result in the memory 42b. When the coefficients of the coefficient multipliers 58 and 60 are both 1, the second total value indicates the total of values corresponding to the phase distortion and the amplitude distortion in each delayed electric power address. Moreover, it may be possible that the coefficient of the coefficient multiplier 58 is a positive number a less than 1 and the coefficient of the coefficient multiplier 60 is (1−α). In such a case, the adder 56 adds the multiplication value $S_d^*$ (t) r (t) of the complex conjugate signal $S_d^*$ (t) and the feedback signal r (t) that is multiplied by a to the second total value multiplied by (1−α) and stores the addition result in the memory 42b. As a result, it is possible to suppress the saturation and prescribe that the second total value is the total value of values corresponding to the phase distortion and the amplitude distortion in each delayed electric power address that are weighted more as the delayed transmission signal $S_d$ (t) is newer.

The range adjuster 43 in FIG. 2 adjusts the upper limit of the determination reference range used by the determiner 44 according to a maximum reference address that is the maximum value among reference addresses that are delayed electric power addresses for which the first total value and the second total value are present. When the maximum reference address is equal to or greater than the upper limit of the determination reference range, the determiner 44 determines that the number of repeats of the data calculator 41 calculating the electric power of the delayed transmission signal $S_d$ (t) and multiplying the complex conjugate signal $S_d^*$ (t) and the feedback signal r (t) is sufficient, in other words the amount of data of the first total value and the second total value stored in the memory 42 is sufficient. In order to reduce variation in the distortion vector calculated by a distortion vector calculator 451 described below, the transmitter 1 repeats the processing by the data calculator 41 until the determiner 44 determines that the number of repeats of the data calculator 41 is sufficient. Moreover, the transmitter 1 may perform the processing by the determiner 44 every given number of times, for every example 1000 times, of the above-described processing by the data calculator 41 being repeated. In Embodiment 1, the range adjuster 43 increments the upper limit when the difference obtained by subtracting the upper limit of the determination reference range from the maximum reference address is a positive difference and decrements the upper limit when the difference is a negative difference. The increment of the upper limit with respect to the positive difference is equal to or greater than the decrement of the upper limit with respect to the negative difference having the same absolute value as the positive difference. For example, assuming that β is a positive number, the increment of the upper limit when the maximum reference address is the upper limit+β is equal to or greater than the decrement of the upper limit when the maximum reference address is the upper limit−β.

In Embodiment 1, when the maximum reference address is greater than the upper limit, the range adjuster 43 regards the minimum natural number greater than the average value of the reference addresses equal to or greater than the upper limit as the upper limit of the determination reference range. Explanation is made using a case in which the reference address includes address values 128, 130, 132, and 135 and the maximum reference address is 135. In such a case, assuming that the upper limit of the determination reference range is 128, the range adjuster 43 sets, based on an average value of 131.25 of 128, 130, 132, and 135, a minimum natural number of 132 greater than the average value as the upper limit of the determination reference range. In other words, the range adjuster 43 increments the upper limit of the determination reference range from 128 to 132.

Moreover, when the maximum reference address is less than the upper limit, the range adjuster 43 sets, based on a result of calculation on the upper limit that is prescribed to decrement the upper limit, a maximum natural number equal to or less than the result of calculation as the upper limit of the determination reference range. For example, the range adjuster 43 sets, based on a result of subtracting a prescribed positive number from the upper limit or multiplying the upper limit by a prescribed positive number less than 1, a maximum natural number equal to or less than the result as the upper limit of the determination reference range. Explanation is made using a case in which the maximum reference address is 125 and the upper limit of the determination reference range is 128. In such a case, the range adjuster 43 subtracts 1, which is a prescribed positive number, from 128 and regards 127 as the upper limit of the determination reference range. Alternatively, the range adjuster 43 regards 126 as the upper limit of the determination reference range, which is the maximum natural number equal to or less than 126.72, which is the result of multiplying 128 by 0.99, which is a prescribed positive number less than 1. In other words, the range adjuster 43 decrements the upper limit of the determination reference range from 128 to 127 or 126.

As the upper limit of the determination reference range lowers, the amount of data used by the distortion vector calculator 451 to calculate the distortion vector becomes smaller. Then, a minimum value is preset for the upper limit of the determination reference range and the range adjuster 43 determines an upper limit of the determination reference range that is equal to or greater than the minimum value. The lower limit of the determination reference range may be a prescribed value or the range adjuster 43 may adjust the lower limit of the determination reference range according to the upper limit of the determination reference range. For example, the range adjuster 43 sets the lower limit of the determination reference range to the maximum natural number equal to or less than the value of the upper limit multiplied by ½. When the upper limit of the determination reference range is 128, the range adjuster 43 sets the lower limit of the determination reference range to 64.

The determiner 44 determines that the number of repeats of the data calculator 41 is sufficient when the maximum reference address is equal to or greater than the upper limit of the determination reference range. The determiner 44 notifies the distortion vector calculator 451 of the determination result. The determiner 44 may determine that the number of repeats of the data calculator 41 is sufficient when the maximum reference address is equal to or greater than the upper limit of the determination reference range and a minimum reference address that is the minimum value among the reference addresses is equal to or less than the lower limit of the determination reference range. Moreover, the determiner 44 may determine that the number of repeats of the data calculator 41 is sufficient when the maximum reference address is equal to or greater than the upper limit of the determination reference range, the minimum reference address is equal to or less than the lower limit of the determination reference range, the number of reference addresses is equal to or greater than a value obtained by multiplying the difference between the maximum reference address and the minimum reference address by a prescribed positive number less than 1, for example ¼.

With the range adjuster 43 adjusting the determination reference range as described above, the upper limit of the determination reference range is incremented as the electric power of the transmission signal increments, and the lower limit of the determination reference range is decremented more gently than when the upper limit is incremented as the electric power of the transmission signal decreases. With the determiner 44 determining whether the amount of data is sufficient based on the determination reference range changing according to the electric power of the transmission signal, it is possible to reduce the time to calculate data necessary for the distortion correction vector update procedure while maintaining distortion correction properties.

When the determiner 44 determines that the number of repeats of the data calculator 41 is sufficient, the vector calculator 45 calculates a distortion correction vector in each transmission electric power address based on a distortion vector calculated from a ratio between the first total value and the second total value in the reference address and outputs the distortion correction vector. The parts of the vector calculator 45 are described. When the determiner 44 determines that the number of repeats of the data calculator 41 is sufficient, the distortion vector calculator 451 calculates a distortion vector from the ratio between the first total value $d_r(a)$ and the second total value $d_t(a)$ as expressed by the equation (4) below.

[Equation 4]

$$d(a) = \frac{d_r(a)}{d_t(a)} \quad (4)$$

Transmission signals are created from data such as sound signals and therefore, distortion vectors are not always obtained for all delayed electric power addresses by the distortion vector calculator 451. Thus, the estimator 452 calculates an estimated distortion vector in each delayed electric power address for which the first total value $d_r(a)$ and the second total value $d_t(a)$ are absent based on the distortion vector calculated by the distortion vector calculator 451. By performing estimation on the delayed electric power addresses for which no data are present to calculate an estimated distortion vector, it is possible to calculate a distortion correction vector described below and reduce the time required for the distortion correction vector update procedure.

Figure 4:
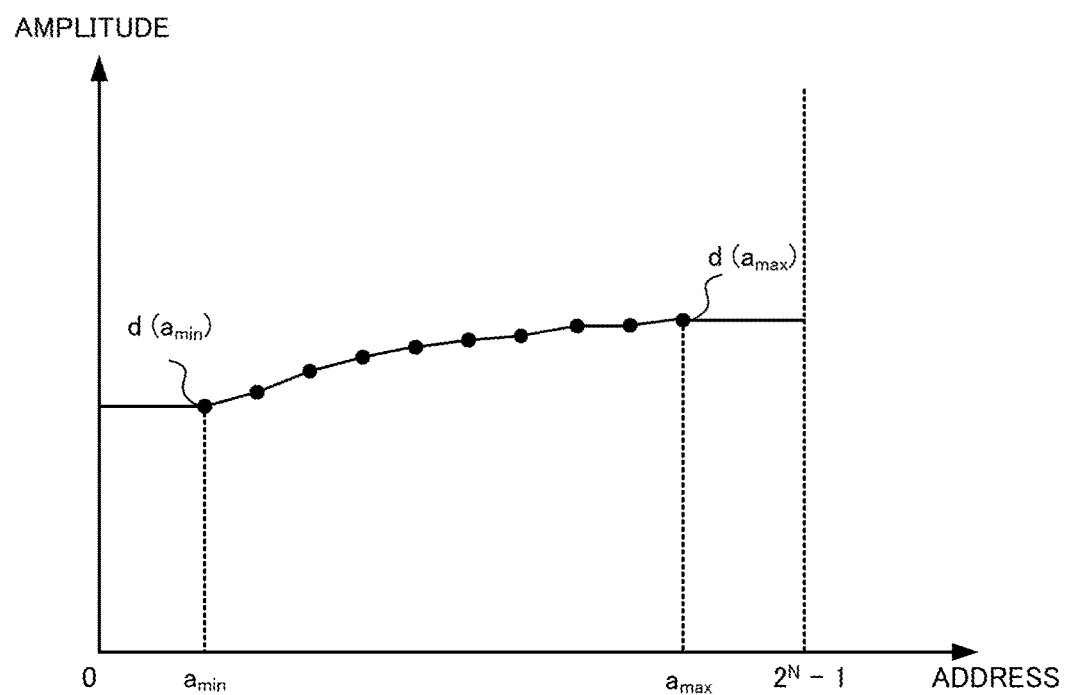
FIG. 4 is a chart illustrating an example calculation of an estimated distortion vector in Embodiment 1.

The estimator 452 estimates distortion vectors in the delayed electric power addresses equal to or greater than the minimum reference address $a_{min}$ and equal to or less than the maximum reference address $a_{max}$ for which the first total value and the second total value are absent, and calculates an estimated distortion vector d' (a) in each delayed electric power address equal to or greater than $a_{min}$ and equal to or less than $a_{max}$. FIG. 4 is a chart illustrating an example calculation of the estimated distortion vector in Embodiment 1. In FIG. 4, the delayed electric power address is plotted as the abscissa and the distortion vector amplitude is plotted as the ordinate. In FIG. 4, the black circles indicate the distortion vectors in the reference addresses. As illustrated in FIG. 4, in Embodiment 1, the estimator 452 performs linear interpolation based on the distortion vectors d (a) in the reference addresses to estimate distortion vectors in delayed electric power addresses equal to or greater than $a_{min}$ and equal to or less than $a_{max}$ for which the first total value and the second total value are absent, and calculates an estimated distortion vector d' (a) in each delayed electric power address. Moreover, the estimator 452 may regard the estimated distortion vector d' (a) corresponding to the delayed electric power addresses less than $a_{min}$ as d ($a_{min}$) and the estimated distortion vector d' (a) corresponding to the delayed electric power addresses greater than $a_{max}$ as d ($a_{max}$). The estimator 452 outputs the estimated distortion vector d' (a). In the case of linear interpolation, the estimated distortion vector d' (a) in the reference addresses output by the estimator 452 is the distortion vector d (a). Using linear interpolation as the interpolation, it is possible to reduce the amount of calculation and reduce the time required for the distortion correction vector update procedure.

The distortion correction vector calculator 453 calculates a distortion correction vector in each transmission electric power address from the estimated distortion vector and outputs the distortion correction vector to the updater 46. The distortion correction vector calculator 453 calculates a distortion correction vector making the error of the distortion correction vector gradually smaller based on the estimated distortion vector d' (a) output by the estimator 452. The distortion correction vector calculator 453 calculates a distortion correction vector in a calculation-target transmission electric power address based on the estimated distortion vector d' (a) in the delayed electric power address coinciding with the transmission electric power address. Using the current, namely n-th, distortion correction vector $L_n$ (a) and estimated distortion vector $d'_n$ (a) output by the estimator 452, the distortion correction vector calculator 453 calculates the next, namely n+1-th, distortion correction vector $L_{n+1}$ (a) as in equation (5) below. A predetermined value is entered in the initial value $L_0$ (a) and, for example, $L_0$ (a)=1. Repeatedly calculating the distortion correction vector using the equation (5) below, $d'_n$ (a) converges to 1 and the distortion in the amplifier 9 is corrected.

[Equation 5]

$$L_{n+1}(a) = L_n(a) \times \frac{1}{d'_n(a)} \quad (5)$$

The distortion correction vector calculator 453 may smooth the distortion correction vector calculated in the above processing. In some cases, the distortion correction vector update procedure may fail to obtain a proper distortion correction vector, thus increasing the distortion. It is possible to suppress increase in the distortion by the distortion correction vector calculator 453 smoothing the distortion correction vector. The distortion correction vector calculator 453 smooths the distortion correction vector by calculating, for example, a ninth degree approximation equation from the distortion correction vector.

Figure 5:
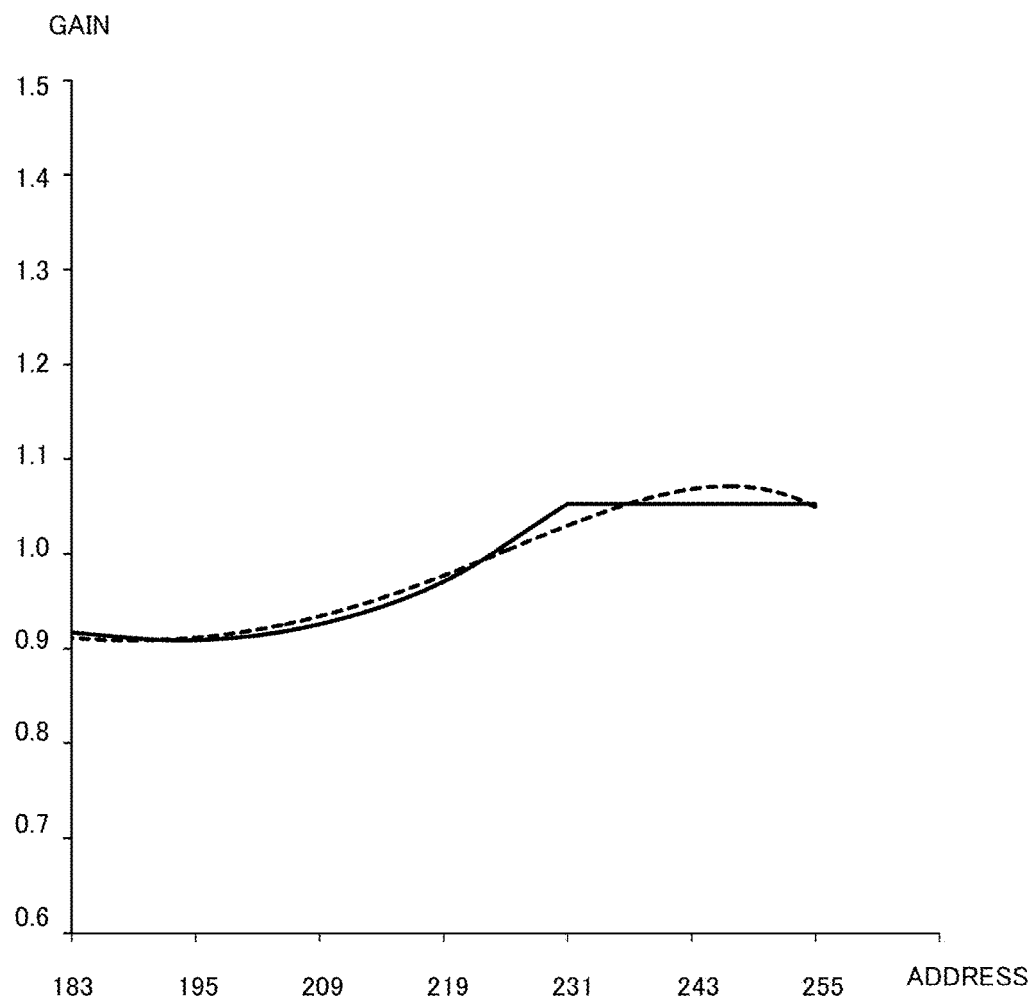
FIG. 5 is a chart illustrating an example gain drop of a distortion correction vector near the maximum value of transmission electric power address in Embodiment 1.

When data for up to the maximum value $2^N-1$ of the delayed electric power address are not obtained and the estimated distortion vector d' (a) corresponding to the delayed electric power addresses greater than $a_{max}$ is regarded as d ($a_{max}$), smoothing may cause the gain of the distortion correction vector to largely drop near the transmission electric power address $2^N-1$. FIG. 5 is a chart illustrating an example gain drop of the distortion correction vector near the maximum value of the transmission electric power address in Embodiment 1. The transmission electric power address is plotted as the abscissa and the gain of the distortion correction vector is plotted as the ordinate. In FIG. 5, the solid line illustrates the gain of the distortion correction vector before smoothing. Here, explanation is made using a case in which distortion vector data are obtained for only up to a delayed electric power address a=232 and the estimated distortion vector corresponding to the delayed electric power addresses a=233 to a=255 is regarded as the distortion vector in the delayed electric power address a=232. By smoothing the distortion correction vector calculated based on the estimated distortion vector calculated as described above by polynomial approximation, or sixth degree polynomial approximation in the case of FIG. 5, the gain of the distortion correction vector as illustrated by the dotted line in FIG. 5 is obtained.

Since the amplifier 9 saturates near the transmission electric power address $2^N-1$, the distortion vector decreases in size near the transmission electric power address $2^N-1$. On the other hand, the distortion correction vector, which is the inverse function, is incremented near the transmission electric power address $2^N-1$. In the case of FIG. 5, the distortion correction vector is abruptly incremented from around the transmission electric power address a=224. No distortion vector data have been obtained for the region of the delayed electric power address $a=a_{max}=233$ and greater corresponding to the region near the transmission electric power address a=224 where the distortion correction vector is abruptly incremented. By smoothing the distortion correction vector calculated based on the estimated distortion vector calculated as described above by polynomial approximation, the gain of the distortion correction vector drops near the transmission electric power address $2^N-1$ as shown in FIG. 5.

In FIG. 5, the gain of the distortion correction vector in the maximum address a=255 illustrated by the dotted line is less than the gain of the distortion correction vector in the preceding transmission electric power address a=243. As the LUT 5 is repeatedly updated in such a state, the gain of the distortion correction vector in the transmission electric power address a=255 more obviously drops and the transmission signal is distorted near the maximum electric power. Then, when the maximum value of the gain of the distortion correction vector in multiple successive transmission electric power addresses from the transmission electric power address $2^N-1$ is greater than the gain of the distortion correction vector in the transmission electric power address $2^N-1$, the distortion correction vector calculator 453 regards the distortion correction vector in a transmission electric power address corresponding to the maximum value of the gain of the distortion correction vector as the distortion correction vector in the transmission electric power addresses greater than that transmission electric power address. Any multiple successive transmission electric power addresses from the transmission electric power address $2^N-1$ can be used according to properties of the amplifier 9. For example, the multiple successive transmission electric power addresses from the transmission electric power address $2^N-1$ are multiple transmission electric power addresses from the transmission electric power address $2^{N-1}$ to the transmission electric power address $2^N \cdot (3/4)$. With the above-described processing, it is possible to prevent abrupt drop in the gain of the distortion correction vector near the transmission electric power address $2^N-1$.

The processing by the distortion correction vector calculator 453 is described using FIG. 5 by way of example. The distortion correction vector calculator 453 stores the transmission electric power address $2^N-1$ and the gain of the distortion correction vector in the transmission electric power address $2^N-1$ as "a maximum gain address" and "the maximum gain" based on the smoothed distortion correction vector. In the example of FIG. 5, "the maximum gain address" is 255 and "the maximum gain" is 1.05. Then, the distortion correction vector calculator 453 calculates the gain from in the transmission electric power address 255 to in a given transmission electric power address, for example a transmission electric power address a=192 in sequence and if the gain in a calculation-target transmission electric power address is greater than "the maximum gain," updates "the maximum gain address" and "the maximum gain" with the calculation-target transmission electric power address and the gain in the calculation-target transmission electric power address.

If "the maximum gain address" remains to be 255 or is 192 after the above-described processing is repeated up to the given transmission electric power address a=192, the distortion correction vector calculator 453 determines that the gain of the distortion correction vector monotonically increases or monotonically decreases. In such a case, the distortion correction vector calculator 453 does not perform the above-described processing of regarding the distortion correction vector in the transmission electric power address corresponding to the maximum value of the gain of the distortion correction vector as the distortion correction vector in the transmission electric power addresses greater than that transmission electric power address. On the other hand, if "the maximum gain address" is greater than 192 and less than 255, for example a transmission electric power address of 250, the distortion correction vector calculator 453 determines that the gain of the distortion correction vector in the transmission electric power address of 250 is the peak value. In such a case, the distortion correction vector calculator 453 regards the distortion correction vector in the transmission electric power address a=250 as the distortion correction vector in the transmission electric power addresses from a=251 to a=255.

The updater 46 updates the distortion correction vector stored in the LUT 5 with the distortion correction vector output by the distortion correction vector calculator 453. After completion of update processing by the updater 46, the transmitter 1 nullifies the first total value and the second total value stored in the memory 42. In other words, the transmitter 1 sets an initial value in the storage regions of the first total value and the second total value in the memory 42.

As the difference between the distortion correction vector output by the distortion correction vector calculator 453 and the distortion correction vector stored in the LUT 5 increases, more significant spurious components may occur. Then, the updater 46 may update the distortion correction vector stored in the LUT 5 in multiple parts according to multiple vectors constituting the difference vector between the distortion correction vector output by the distortion correction vector calculator 453 and the distortion correction vector stored in the LUT 5. Explanation is made using a case in which for an n-th distortion correction vector $L_n$ (a) stored in the LUT 5, the distortion correction vector calculator 453 outputs an n+1-th distortion correction vector $L_{n+1}$ (a). $L_{n\_i}$ (a) is the I component of $L_n$ (a) and $L_{n\_q}$ (a) is the Q component of $L_n$ (a). $L_{n+1\_i}$ (a) is the I component of $L_{n+1}$ (a) and $L_{n+1\_q}$ (a) is the Q component of $L_{n+1}$ (a). When the updater 46 updates the distortion correction vector in M parts, the I component of the distortion correction vector after the k-th update (1≤k≤M) is expressed by the expression (6) below and the Q components is expressed by the expression (7) below. Updating the distortion correction vector in multiple parts makes it possible to suppress occurrence of spurious components. When the LUT 5 is realized by, for example, a field programmable gate array (FPGA) and operates on a different piece of hardware from the distortion analyzer 22, it may be possible that the updater 46 sends the distortion correction vector to the LUT 5 and the LUT 5 updates the distortion correction vector in multiple parts.

[Expression 6]

$$L_{n\_i}(a) + \frac{L_{n+1\_i}(a) - L_{n\_i}(a)}{M} \cdot k \qquad (6)$$

[Expression 7]

$$L_{n\_q}(a) + \frac{L_{n+1\_q}(a) - L_{n\_q}(a)}{M} \cdot k \qquad (7)$$

With the above-described processing, the distortion correction vector stored in the LUT 5 is updated and the DPD processor 2 performs the pre-distortion based on the updated distortion correction vector, whereby it is possible to suppress distortion in the amplifier 9 even if the amount of distortion occurring in the amplifier 9 changes while the transmitter 1 is in operation.

Figure 6:
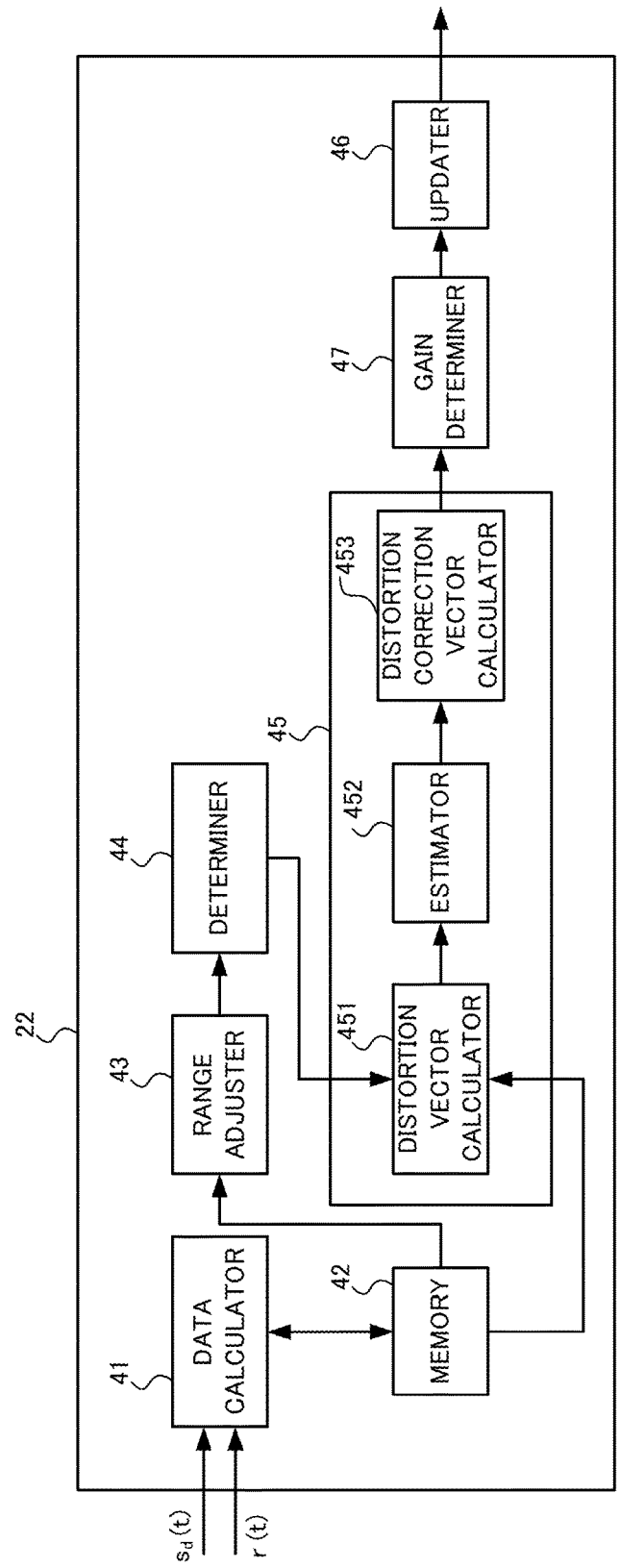
FIG. 6 is a block diagram illustrating another example configuration of the distortion analyzer according to Embodiment 1.

FIG. 6 is a block diagram illustrating another example configuration of the distortion analyzer according to Embodiment 1. The distortion analyzer 22 illustrated in FIG. 6 further includes a gain determiner 47 determining whether the gain of the distortion correction vector output by the vector calculator 45 is equal to or less than a gain threshold that is a prescribed threshold in addition to the configuration of the distortion analyzer 22 illustrated in FIG. 2. When a pre-distorted signal exceeds the maximum input level of the D-A converter 6, in other words causes the saturation, distortion in the analog signal occurs. When the gain determiner 47 determines that the gain of the distortion correction vector is equal to or less than the gain threshold, the transmitter 1 performs the processing by the updater 46. As described above, after completion of update processing by the updater 46, the transmitter 1 nullifies the first total value and the second total value stored in the memory 42. Moreover, when the gain determiner 47 determines that the gain of the distortion correction vector is greater than the gain threshold, the transmitter 1 nullifies the first total value and the second total value stored in the memory 42 without performing the processing by the updater 46. This suppresses occurrence of the saturation caused by a transmission signal pre-distorted by the DPD processor 2 and exceeding the maximum input level of the D-A converter 6. The gain threshold is the ratio between the signal entered into the DPD processor 2 and the signal output from the DPD processor 2. In the example of FIG. 1, the gain threshold is the ratio between the maximum electric power of signals entered into the DPD processor 2 and the maximum input electric power of the D-A converter 6. Moreover, the transmitter 1 adjusts the gain adjuster 11 to increase the feedback gain when the gain determiner 47 determines that the gain of the distortion correction vector is greater than the gain threshold. The gain adjuster 11 may be provided between the LUT updater 20 and the A-D converter 13. In such a case, the gain adjuster 11 adjusts the feedback gain by multiplying the A-D-converted feedback signal r (t) by a coefficient. As the feedback gain increases, the gain of the estimated distortion vector d'$_n$ (a) in the expression (5) above increases and the gain of the distortion correction vector decreases. Provision of the gain determiner 47 makes it possible to suppress the saturation of the D-A converter 6.

Figure 7:
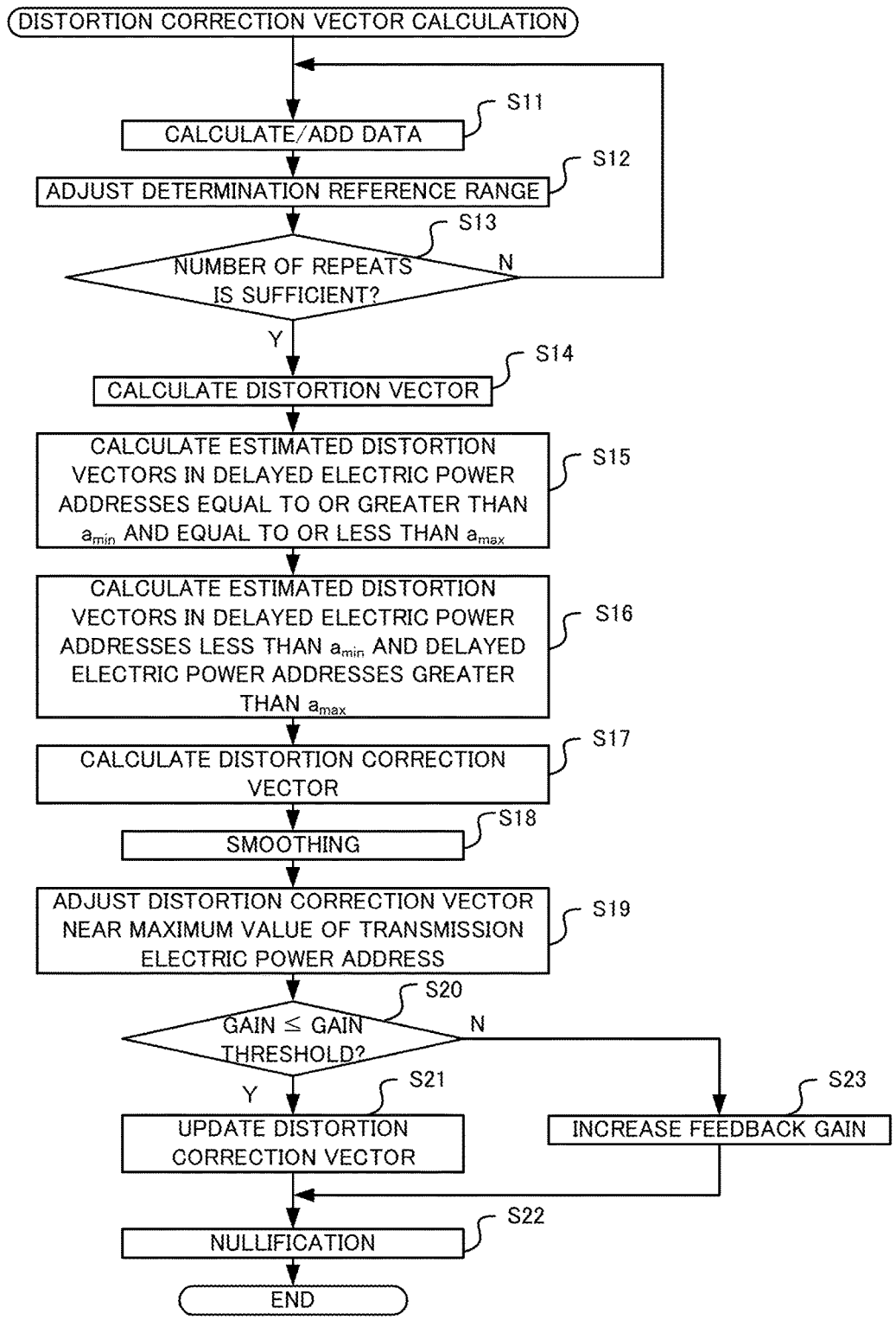
FIG. 7 is a flowchart illustrating an example operation of the distortion correction vector calculation procedure executed by the transmitter according to Embodiment 1.

FIG. 7 is a flowchart illustrating an example operation of the distortion correction vector calculation procedure executed by the transmitter according to Embodiment 1. The data calculator 41 calculates and adds to the first total value stored in the memory 42a the electric power of the delayed transmission signal $S_d$ (t), and calculates and adds to the second total value stored in the memory 42b the multiplication value $S_d^*$ (t) r (t) of the complex conjugate $S_d^*$ (t) and the feedback signal r (t) (Step S11). The range adjuster 43 adjusts the upper limit of the determination reference range according to the maximum reference address (Step S12). The determiner 44 determines whether the number of repeats of the data calculator 41 is sufficient based on the maximum reference address and the determination reference range (Step S13). If the maximum reference address is less than the upper limit of the determination reference range, the determiner 44 determines that the number of repeats of the data calculator 41 is not sufficient (Step S13; N), whereby the processing returns to Step S11 and the above-processing is repeated.

If the maximum reference address is equal to or greater than the upper limit of the determination reference range, the determiner 44 determines that the number of repeats of the data calculator 41 is sufficient (Step S13; Y), whereby the distortion vector calculator 451 calculates the distortion vector from the ratio between the first total value and the second total value (Step S14). The estimator 452 estimates the distortion vectors in the delayed electric power addresses equal to or greater than $a_{min}$ and equal to or less than $a_{max}$ for which the first total value and the second total value are absent based on the distortion vectors in the reference addresses, and calculates an estimated distortion vector in each delayed electric power address (Step S15). The estimator 452 calculates estimated distortion vectors in the delayed electric power addresses less than $a_{min}$ and greater than $a_{max}$ by regarding the estimated distortion vector corresponding to the delayed electric power addresses less than $a_{min}$ as the estimated distortion vector in $a_{min}$ and regarding the estimated distortion vector corresponding to the delayed electric power addresses greater than $a_{max}$ as the estimated distortion vector in $a_{max}$ (Step S16).

The distortion correction vector calculator 453 calculates a distortion correction vector for each transmission electric power from the estimated distortion vector (Step S17). The distortion correction vector calculator 453 smooths the distortion correction vector (Step S18).

When the maximum value of the gain of the distortion correction vector in multiple successive transmission electric power addresses from the transmission electric power address $2^N-1$ is greater than the gain of the distortion correction vector in the transmission electric power address $2^N-1$, the distortion correction vector calculator 453 regards the distortion correction vector in the transmission electric power address corresponding to the maximum value of the gain of the distortion correction vector as the distortion correction vector in the transmission electric power addresses greater than that transmission electric power address. As a result, the distortion correction vector calculator 453 adjusts the distortion correction vector near the transmission electric power address $2^N-1$ (Step S19).

The gain determiner 47 determines whether the gain of the smoothed distortion correction vector is equal to or less than the gain threshold (Step S20). If the gain determiner 47 determines that the gain of the distortion correction vector is equal to or less than the gain threshold (Step S20; Y), the updater 46 updates the distortion correction vector stored in the LUT 5 (Step S21). If the gain determiner 47 determines that the gain of the distortion correction vector is greater than the gain threshold (Step S20; N), the transmitter 1 adjusts the gain adjuster 11 to increase the gain of the feedback signal without performing the processing by the updater 46 in Step S21 (Step S23). After completion of processing in Steps S21 and S23, the transmitter 1 nullifies the first total value and the second total value stored in the memory 42 (Step S22). After completion of processing in Step S22, the transmitter 1 ends the distortion correction vector calculation procedure. The transmitter 1 repeats the above-described distortion correction vector calculation procedure at a prescribed interval.

As described above, the transmitter 1 according to Embodiment 1 makes it possible to reduce the time required for the distortion correction vector update procedure while maintaining distortion correction properties by adjusting the upper limit of the determination reference range according to the maximum reference address.

Embodiment 2

Figure 8:
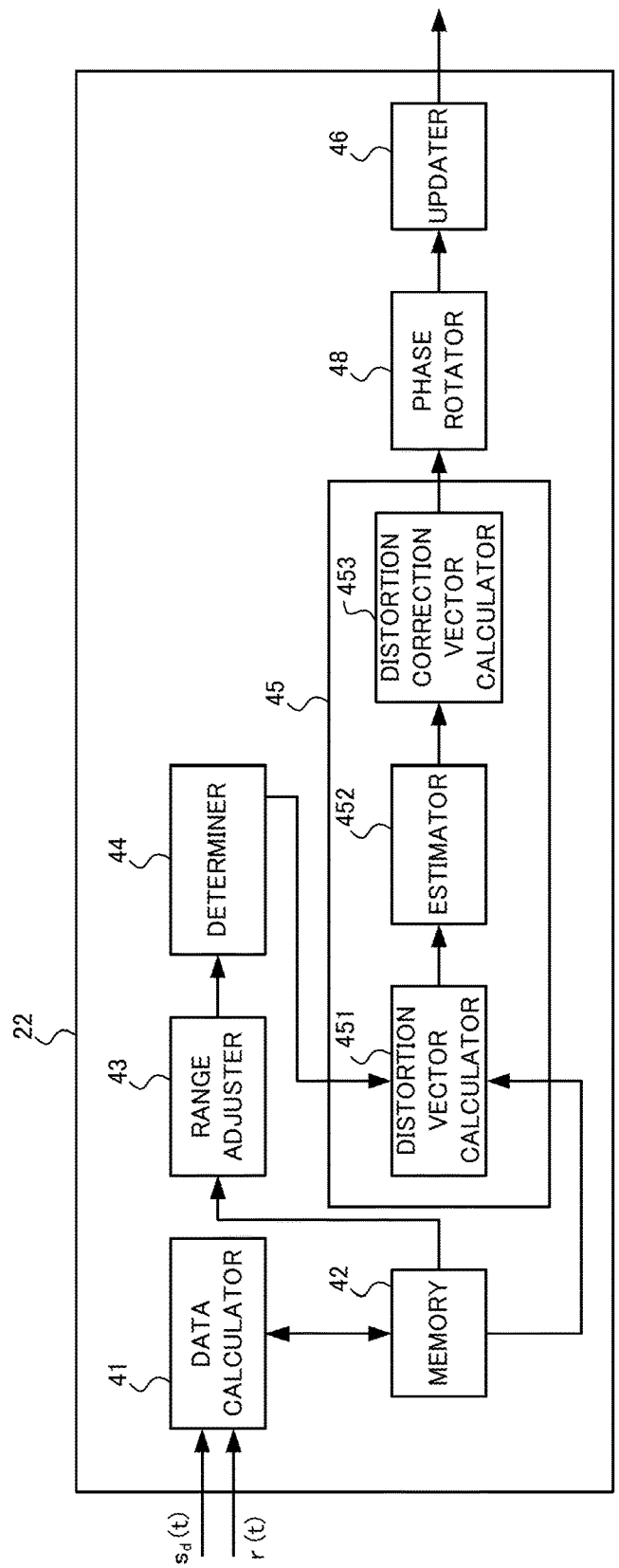
FIG. 8 is a block diagram illustrating an example configuration of the distortion analyzer according to Embodiment 2 of the present disclosure.

FIG. 8 is a block diagram illustrating an example configuration of the distortion analyzer according to Embodiment 2 of the present disclosure. The distortion analyzer 22 of the transmitter 1 according to Embodiment 2 includes a phase rotator 48 in addition to the configuration of the distortion analyzer 22 of the transmitter 1 according to Embodiment 1 illustrated in FIG. 2. Passing through the D-A converter 6, an analog circuit between the D-A converter 6 and the A-D converter 13, and the A-D converter 13, phase rotation in the feedback signal occurs. The distortion correction vector includes phase rotation in each transmission electric power address due to distortion and phase rotation common to all transmission electric power addresses. As the phase rotation common to all transmission electric power addresses increases, the phase change upon update of the LUT 5 increases, whereby a broader spectrum and abnormal noise may occur. Then, in Embodiment 2, the phase rotator 48 of the distortion analyzer 22 rotates the phase of the calculated distortion correction vector by a prescribed quantity and outputs the phase-rotated distortion correction vector so as to reduce the phase change upon update of the LUT 5.

For example, the phase rotator 48 rotates the phase of the distortion correction vector calculated by the distortion correction vector calculator 453 for each transmission electric power address by a common prescribed quantity. The common prescribed quantity is, for example, the phase of a vector presenting the average of the distortion correction vectors in all transmission electric power addresses, the phase of a vector presenting the average of the distortion correction vectors in the transmission electric power addresses within a prescribed range, the phase of the distortion correction vector in a prescribed transmission electric power address, or the like. As the prescribed transmission electric power address, for example, the median value of the reference addresses, the median value of the transmission electric power addresses, or the like can be used. Explanation is made using a case in which the phase of a vector presenting the average of the distortion correction vectors in all transmission electric power addresses is used as the common prescribed quantity. Assuming that the vector presenting the average of the distortion correction vectors in all transmission electric power addresses is $L_{avg}$, the I component of $L_{avg}$ is $L_{avg\_i}$, and the Q component of $L_{avg}$ is $L_{avg\_q}$, the I component $C_i$ of a phase correction vector C and the Q component $C_q$ of the phase correction vector C are expressed by the equation (8) and the equation (9) below.

[Equation 8]
$$C_i = \frac{L_{avg\_i}}{\sqrt{L_{avg\_i}^2 + L_{avg\_q}^2}} \quad (8)$$

[Equation 9]
$$C_q = \frac{-L_{avg\_q}}{\sqrt{L_{avg\_i}^2 + L_{avg\_q}^2}} \quad (9)$$

The phase rotator 48 complex-multiplies the distortion correction vector L (a) in all transmission electric power addresses by the phase correction vector C to rotate the phase of the distortion correction vector calculated for each transmission electric power address by a common prescribed quantity. It may be possible to calculate the arc tangent for the vector presenting the average of the distortion correction vectors in all transmission electric power addresses and each of the distortion correction vectors in all transmission electric power addresses, and calculate the phase difference between the vector presenting the average of the distortion correction vectors in all transmission electric power addresses and each of the distortion correction vectors in all transmission electric power addresses. The phase rotator 48 rotates the phase of the distortion correction vector calculated for each transmission electric power address by the common prescribed quantity according to the calculated phase difference. The phase rotator 48 outputs the phase-rotated distortion correction vector. The updater 46 updates the distortion correction vector stored in the LUT 5 with the phase-rotated distortion correction vector. As in Embodiment 1, after completion of processing by the updater 46, the transmitter 1 nullifies the first total value and the second total value stored in the memory 42.

Figure 9:
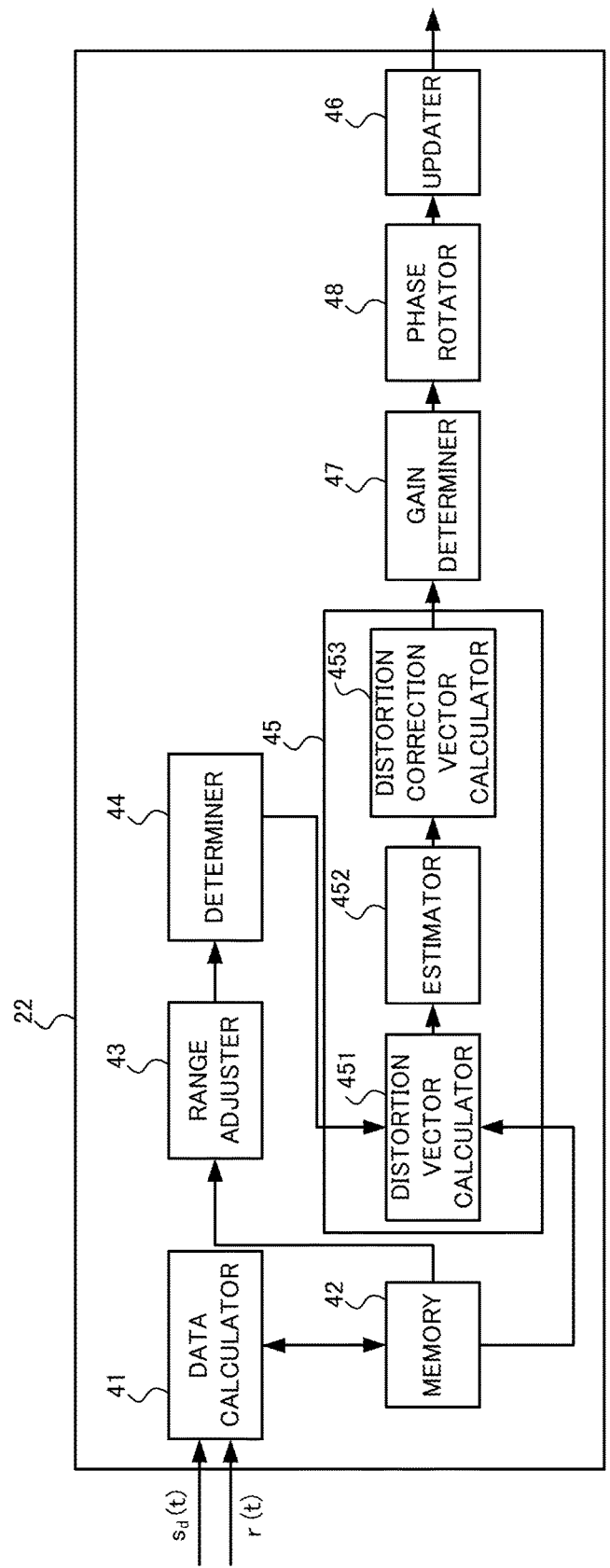
FIG. 9 is a block diagram illustrating another example configuration of the distortion analyzer according to Embodiment 2.

FIG. 9 is a block diagram illustrating another example configuration of the distortion analyzer according to Embodiment 2. The distortion analyzer 22 illustrated in FIG. 9 includes the phase rotator 48 in addition to the configuration of the distortion analyzer 22 according to Embodiment 1 illustrated in FIG. 6. In the example of FIG. 9, when the gain determiner 47 determines that the gain of the distortion correction vector is equal to or less than a gain threshold, the transmitter 1 performs the processing by the phase rotator 48 and the updater 46. On the other hand, when the gain determiner 47 determines that the gain of the distortion correction vector is greater than a gain threshold, the transmitter 1 nullifies the first total value and the second total value stored in the memory 42 without performing the processing by the phase rotator 48 and the updater 46.

FIG. 10 is a flowchart illustrating an example operation of the distortion correction vector calculation procedure executed by the transmitter according to Embodiment 2 of the present disclosure. The processing in Steps S11 to S20 is the same as the processing executed by the transmitter 1 according to Embodiment 1 illustrated in FIG. 7. If the gain determiner 47 determines that the gain of the distortion correction vector is equal to or less than a gain threshold (Step S20; Y), the phase rotator 48 rotates the phase of the distortion correction vector by a prescribed quantity (Step S201). The updater 46 updates the distortion correction vector stored in the LUT 5 with the phase-rotated distortion correction vector (Step S21). The processing in Steps S22 and S23 is the same as the processing executed by the transmitter 1 according to Embodiment 1 shown in FIG. 7.

As described above, the transmitter 1 according to Embodiment 2 makes it possible to reduce change in the phase upon update of the LUT 5 by rotating the phase of the distortion correction vector. As a result, it is possible to suppress occurrence of a broader spectrum and abnormal noise.

Embodiments of the present disclosure are not confined to the above-described embodiments. The circuit configurations in the above-described embodiments are given by way of example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A transmitter, comprising:
an amplifier to amplify entered signals;
a look-up table to store a distortion correction vector for each transmission electric power address corresponding to electric power of a transmission signal;
a digital pre-distortion processor to correct the transmission signal according to the distortion correction vector stored in the look-up table and to enter the corrected transmission signal into the amplifier;
a data calculator to repeat, based on a delayed transmission signal that is a signal as a result of delaying the transmission signal and a feedback signal that is feedback of the transmission signal amplified by the amplifier, calculation of electric power of the delayed transmission signal, and calculation of a multiplication value of the feedback signal and a complex conjugate of the delayed transmission signal;
a memory to store, for each delayed electric power address corresponding to the electric power of the delayed transmission signal, a first total value that is a total of the repeatedly calculated electric power of the delayed transmission signal and a second total value that is a total of the repeatedly calculated multiplication value;
a range adjuster to adjust an upper limit of a determination reference range according to a maximum reference address that is a maximum value among reference addresses that are the delayed electric power addresses for which the first total value and the second total value are present;
a determiner to determine, when the maximum reference address is equal to or greater than the upper limit of the determination reference range, that a number of repeats of the calculation of the electric power of the delayed transmission signal and the calculation of the multiplication value that are performed by the data calculator is sufficient;
a vector calculator to calculate the distortion correction vector based on a distortion vector calculated from a ratio between the first total value and the second total value in each reference address and to output the distortion correction vector when the determiner determines that the number of repeats is sufficient; and
an updater to update the distortion correction vector stored in the look-up table based on the distortion correction vector output by the vector calculator,
wherein the first total value and the second total value stored in the memory are nullified after completion of processing by the updater.

2. The transmitter according to claim 1, wherein
the range adjuster increments the upper limit when a difference obtained by subtracting the upper limit from the maximum reference address is a positive difference, and decrements the upper limit when the difference is a negative difference, and
an increment of the upper limit with respect to the positive difference is equal to or greater than a decrement of the upper limit with respect to the negative difference having the same absolute value as the positive difference.

3. The transmitter according to claim 2, wherein
the range adjuster sets, based on an average value of the reference addresses equal to or greater than the upper limit, a minimum natural number greater than the average value as the upper limit when the difference is positive, and
the range adjuster sets, based on a result of calculation on the upper limit that is prescribed to decrement the upper limit, a maximum natural number equal to or less than the result of calculation as the upper limit when the difference is negative.

4. The transmitter according to claim 1, wherein
the range adjuster adjusts a lower limit of the determination reference range according to the upper limit.

5. The transmitter according to claim 1, wherein
the determiner determines that the number of repeats is sufficient when the maximum reference address is equal to or greater than the upper limit and a minimum reference address that is a minimum value among the reference addresses is equal to or less than a lower limit of the determination reference range.

6. The transmitter according to claim 5, wherein
the determiner determines that the number of repeats is sufficient when the maximum reference address is equal to or greater than the upper limit and the minimum reference address is equal to or less than the lower limit of the determination reference range and a number of reference addresses is equal to or greater than a value obtained by multiplying a difference between the maximum reference address and the minimum reference address by a positive number less than 1.

7. The transmitter according to claim 1, wherein
the updater updates the distortion correction vector stored in the look-up table at multiple times according to a plurality of vectors constituting a difference vector between the distortion correction vector output by the vector calculator and the distortion correction vector stored in the look-up table.

8. The transmitter according to claim 1, further comprising:
a phase rotator to rotate a phase of the distortion correction vector output by the vector calculator by a prescribed quantity and to output the phase-rotated distortion correction vector,
wherein the updater performs processing of updating the distortion correction vector stored in the look-up table based on the distortion correction vector that is phase-rotated by the phase rotator.

9. The transmitter according to claim 8, wherein
the phase rotator rotates the phase of the distortion correction vector by a common prescribed quantity.

10. The transmitter according to claim 1, wherein
the vector calculator calculates an estimated distortion vector, in each of the delayed electric power addresses for which the first total value and the second total value are absent, each delayed electric power addresses being equal to or greater than a minimum reference address that is a minimum value among the reference addresses and equal to or less than the maximum reference address, by interpolation based on the distortion vectors in the reference addresses, regards the distortion vector corresponding to the minimum reference address as an estimated distortion vector corresponding to the delayed electric power address that is less than the minimum reference address and regards the distortion vector corresponding to the maximum reference address as an estimated distortion vector corresponding to the delayed electric power address that is greater than the maximum reference address, and calculates the distortion correction vector from each estimated distortion vector.

11. The transmitter according to claim 1, wherein
when a maximum value of a gain of the distortion correction vector in a plurality of successive transmission electric power addresses from a maximum value of the transmission electric power address is greater than a gain of the distortion correction vector in the maximum value of the transmission electric power address, the vector calculator regards the distortion correction vector in the transmission electric power address corresponding to the maximum value of the gain of the distortion correction vector as the distortion correction vector in the transmission electric power address greater than the transmission electric power address corresponding to the maximum value of the gain of the distortion correction vector.

12. The transmitter according to claim 1, further comprising:
a gain determiner to determine whether a gain of the distortion correction vector output by the vector calculator is equal to or less than a gain threshold,
wherein when the gain determiner determines that the gain of the distortion correction vector is equal to or less than the gain threshold, the processing by the updater is performed, and
when the gain determiner determines that the gain of the distortion correction vector is greater than the gain threshold, the first total value and the second total value stored in the memory are nullified without performing the processing by the updater.

13. The transmitter according to claim 12, further comprising:
a gain adjuster to increase a gain of the feedback signal when the gain determiner determines that the gain of the distortion correction vector is greater than the gain threshold.

14. A distortion correction method executed by a transmitter correcting a transmission signal according to a distortion correction vector stored in a look-up table for each transmission electric power address corresponding to electric power of the transmission signal and amplifying the transmission signal with an amplifier, comprising the following:
repeating, based on a delayed transmission signal that is a signal as a result of delaying the transmission signal and a feedback signal that is feedback of the transmission signal amplified by the amplifier, calculation of electric power of the delayed transmission signal, and calculation of a multiplication value of the feedback signal and a complex conjugate of the delayed transmission signal;
calculating, for each delayed electric power address corresponding to the electric power of the delayed transmission signal, a first total value that is a total of the repeatedly calculated electric power of the delayed transmission signal and a second total value that is a total of the repeatedly calculated multiplication value;
adjusting an upper limit of a determination reference range according to a maximum reference address that is a maximum value among reference addresses that are the delayed electric power addresses for which the corresponding first total value and second total value are present;
determining, when the maximum reference address is equal to or greater than the upper limit of the determination reference range, that a number of repeats of calculating the electric power of the delayed transmission signal and calculating the multiplication value is sufficient;
calculating the distortion correction vector based on a distortion vector calculated from a ratio between the first total value and the second total value in the reference address when determined that the number of repeats is sufficient; and
updating the distortion correction vector stored in the look-up table based on the distortion correction vector.

* * * * *